(12) United States Patent
Flynn et al.

(10) Patent No.: US 7,512,859 B2
(45) Date of Patent: Mar. 31, 2009

(54) SYSTEM AND METHODS FOR IMAGE MANAGEMENT

(75) Inventors: William Patrick Flynn, San Francisco, CA (US); Paul D. Taratino, Santa Cruz, CA (US); Emily Josephine Butler, San Francisco, CA (US)

(73) Assignee: Shutterfly, Inc., Redwood City, CA (US)

( * ) Notice: Subject to any disclaimer, the term of this patent is extended or adjusted under 35 U.S.C. 154(b) by 624 days.

(21) Appl. No.: 11/254,265

(22) Filed: Oct. 20, 2005

(65) Prior Publication Data

US 2007/0112850 A1 May 17, 2007

(51) Int. Cl.
G06F 11/00 (2006.01)
(52) U.S. Cl. .......................... 714/746; 714/755; 714/40
(58) Field of Classification Search ................. 714/746, 714/755, 40, 23, 15; 707/3, 104.1
See application file for complete search history.

(56) References Cited

U.S. PATENT DOCUMENTS

| | | | |
|---|---|---|---|
| 5,287,199 A * | 2/1994 | Zoccolillo | ................... 358/402 |
| 5,974,401 A | 10/1999 | Enomoto | |
| 6,017,157 A | 1/2000 | Garfinkle et al. | |
| 6,064,397 A | 5/2000 | Herregods | |
| 6,154,295 A | 11/2000 | Fredlund | |
| 6,288,719 B1 | 9/2001 | Squilla | |
| 6,349,194 B1 | 2/2002 | Nozaki | |
| 6,362,900 B1 | 3/2002 | Squilla | |
| 6,388,732 B1 | 5/2002 | William | |
| 6,570,640 B1 | 5/2003 | Garfinkle et al. | |
| 6,667,814 B1 | 12/2003 | Tillotson | |
| 6,727,909 B1 | 4/2004 | Matsumura | |
| 6,889,341 B2 * | 5/2005 | Collins et al. | .................. 714/23 |
| 7,032,130 B2 * | 4/2006 | Yamamoto et al. | ............ 714/13 |
| 7,058,879 B2 * | 6/2006 | Ramanzin | ................... 714/798 |
| 7,197,513 B2 * | 3/2007 | Tessman et al. | .......... 707/104.1 |

* cited by examiner

Primary Examiner—Esaw T Abraham
Assistant Examiner—Fritz Alphonse
(74) Attorney, Agent, or Firm—Xin Wen

(57) ABSTRACT

An image management system includes a first storage device configured to store a list of image identifiers indexed by one or more image property descriptors, wherein each of the image identifiers corresponds to a digital image, an index processor in communication with the first storage device, configured to write the image identifiers and the associated image property descriptors for each image identifier in the image index storage, and a search processor in communication with the first storage device, configured to receive a specified image property descriptor and to identify one or more image identifiers that match the specified image property descriptor.

20 Claims, 1 Drawing Sheet

SYSTEM AND METHODS FOR IMAGE MANAGEMENT

CROSS-REFERENCES TO RELATED INVENTIONS

Figure 1:
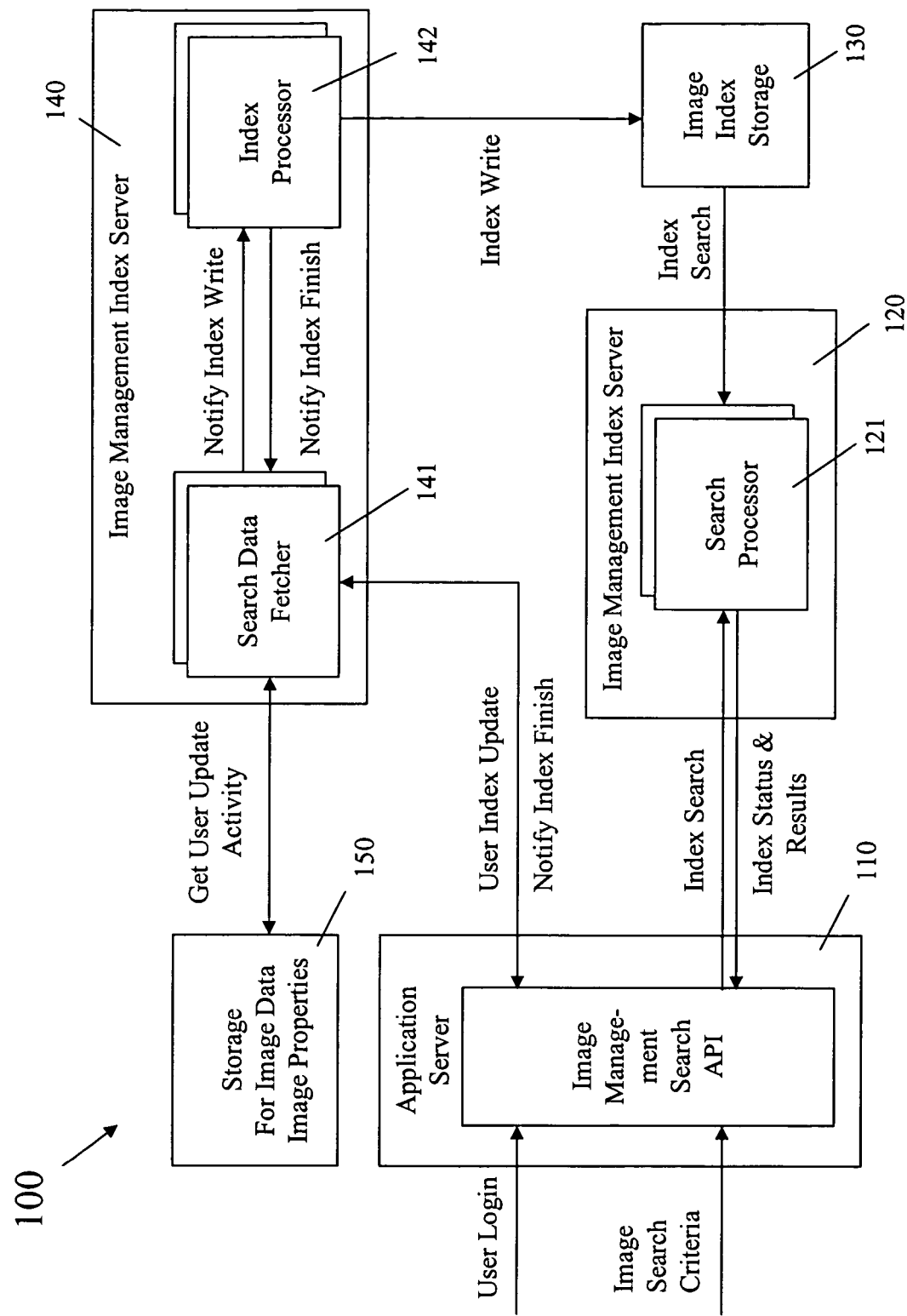

The present invention is related to commonly assigned U.S. patent application Ser. No. 10/920,952, filed on Aug. 18, 2004, titled "Multi-tier data storage system", which claims priority to U.S. patent application Ser. No. 09/428,871, filed on Oct. 27, 1999, titled "Multi-tier data storage system", now issued as U.S. Pat. No. 6,839,803, and U.S. patent application Ser. No. 11/193,943, filed on Jul. 28, 2005, titled "Printing images in an optimized manner". The disclosure of these related applications are incorporated herein by reference.

TECHNICAL FIELD

This application relates to the utilization of digital images, specifically the organization, the management, and the search of digital images.

BACKGROUND

In recent years, photography has been rapidly transformed from chemical based technologies to digital imaging technologies. Digital images captured by digital cameras can be stored in computers and viewed on display devices. The user can also store, organize, manage, edit, and enhance his or her images at a central network location provided by an image service provider such as Shutterfly, Inc. The user can share his or her images with a number of recipients. Users can also order image-based products such as image prints, photo books, photo calendars, photo mug, photo T-shirt, and so on. Over the years, a user can store several thousands or tens of thousands of digital images at a central network location. Finding the most memorable images from a few years can become a difficult task. It is therefore desirable to provide means to allow users to manage and organize a large number of images in an efficient manner.

SUMMARY

In one aspect, the present application relates to an image management system, comprising.

a first storage device configured to store a list of image identifiers indexed by one or more image property descriptors, wherein each of the image identifiers corresponds to a digital image;

an index processor in communication with the first storage device, configured to write the image identifiers and the associated image property descriptors for each image identifier in the image index storage; and a search processor in communication with the first storage device, configured to receive a specified image property descriptor and to identify one or more image identifiers that match the specified image property descriptor.

In another aspect, the present application relates to an image management system, comprising.

a first storage device configured to store a list of image identifiers indexed by one or more image property descriptors in a plurality of user directories each indexed by a unique user identifier, wherein each of the image identifiers corresponds to a digital image;

an index processor in communication with the first storage device, configured to write the image identifiers and the associated image property descriptors in different user directories in the image index storage; and a search processor in communication with the first storage device, configured to receive a specified image property descriptor for a user identifier and to identify one or more image identifiers that match the specified image property descriptor for the user identifier.

Embodiments may include one or more of the following advantages. The disclosed system and methods provide an efficient and accessible network-based image management system. The digital images from a plurality of users can be stored on image storage. Each image is identified by a unique image identifier and can be assigned with one or more image property descriptors. Each user is identified by a user identifier. The list of image identifiers is indexed by user identifier and the image property descriptors in a flat file. When a user needs to find his or her images having certain image properties, the images can be quickly identified by matching the user identifier and the image property descriptors. No time-consuming data base queries are necessary. The process of finding images is faster and more efficient.

Another advantage of the disclosed system and methods is that the image management and image archival is simplified by decoupling the image archive system and the image organization system. The digital images are stored on image storage with each digital image accessible at a network address. Each image is identified by a unique image identifier. The image organization is a flat file that includes a tabulation of image identifiers and their network locations. Each image entry can also include user identifier and image property descriptors. This arrangement allows a user quickly finding the digital images associated with a specific user identifier and image property descriptors without crawling image archive or image database.

The disclosed system and methods can update the user identifiers, the image identifiers, and the image property descriptors in accordance to the recent user activities. New user identifiers are created when new users sign up for the imaging services. New image identifiers are created when new images are uploaded into the network-based image management system. Image property descriptors can be automatically created by the network-based image management system or by a user, which help to categorize the digital images.

Yet another advantage of the network-based image management system is that the categorization of digital images can be personalized specific to each user. One user can have a wedding category while another has a baseball image property. The user specific image property descriptors allow images most efficiently managed. The image indices are not burdened with a long list of image property descriptors that are not relevant to a specific user as in some prior art systems.

DRAWING DESCRIPTIONS

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

FIG. 1 illustrates a block diagram of a network-based image management system.

DETAILED DESCRIPTION

A network-based image management system 100 as shown in FIG. 1 includes an application server 110, an image index management server 120, image index storage 130, index management index server 140, and the storage 150. The application server 110 interfaces with a user through a computer network such as the Internet. The application server 110 allows a user to set up an account at the network-based image management system 100 with a unique user identifier (or user ID). The user can upload images to the application server 110 to be stored in the storage 150. The user can define certain image property descriptors such as file name, image title, order prints based on the uploaded digital image, and enter or select text information for the back of an image print. The user can also selection favorite images among the uploaded images and tag them as "favorite". The user can also create keywords that he or she sees suitable for ease of categorizing his or her images. These image properties can be stored as image property descriptors in association with the image identifiers in the storage 150. Some image properties can be automatically saved by the application server 110 to the storage 150 without user intervention. These image property descriptors may include image capture date, image capture time, image upload date, product order information, image view time, image edition time, etc.

The application server 110 can also receive user requests on searching images, viewing images, organizing images, editing and enhancing images, and order products based on the digital images. The application server 110 also monitors the update status of the image index storage 130. The application server 110 can periodically checks the update status of the image indices on the image index storage 130 and determines the need for an index update. The update can include writing identifiers for all recent users and recent images from the last update as well as corresponding image property descriptors such as keywords, file names, image capture times, etc. The update can occur as the time when the user logs in, logs out, or at other predetermined times.

The image management index server 140 includes a search data fetcher 141 and an index processor 142 that are in communications with each other. The search data fetcher 141 can receive updated information about user indices from the application server 110 and reversely update the application server 110 when the update of the image indices is finished at the image index storage 130. The search data fetcher 141 can communicate with the storage 150 to receive updated imaged image property descriptors and the image locations for different image identifiers. The command for image index update is received by the index processor 142.

The index processors 142 accumulate all updated image index information and formulate them in the same data structure used in the image index storage 130. When the index processor 142 receives an index update order, it initiates writing actions in the image index storage 130.

The image index update can include two types of updates: a complete rebuild of all image index files and incremental update that only adds incremental image-index information from the last update. The complete rebuild involves writing new image index files in the image index storage 130 by reading data from the storage 150. The incremental update involves trolling storage 150 for image property descriptors in the database for image properties to locate the updated information from the last update of the image index in image index storage 130. Only the updated information is received by the search data fetcher 141 to the index processor 142 to be subsequently writing to update the index files on the image index storage 130.

The image management index server 140 can include a plurality of search data fetchers 141 and a plurality of index processors 142. A software application can be used to manage the workload at the search data fetcher 141 to the index processor 142 to ensure efficient and even flow of the tasks. Furthermore, the network-based image management system 100 can include a plurality of image management index servers 140. A load balancer can be included optimize the workloads among different image management index servers 140.

The image index storage 130 is typically mounted NFS hard drives. The image index includes a data structure that is indexed by user identifiers and image identifiers. Each user can include a specific set of image property descriptors that tag along with the image identifiers. Some image indices can be based on image properties that are general to all users and images, which can include, for example, image capture time, image upload time, image view time, product order time, etc.

The image indices can be easily and quickly searched by a search processor 121 in the image management index server 120 when the image management index server receives a search command from the application server 110. The searches can be conducted with similar efficiency as searching a flat file in a file folder on a computer hard drive. For instance, the search can involve locating the image index file for the specified user identifier in the user's directory, and subsequently searching image files having specific image indices. The image indices can be based on general or user-specific image properties. The search processor 121 reads data from the index data structure on the image index storage 130 and returns data records to the application server 130. The user specific image property descriptors allow images most efficiently managed. The image indices are not burdened with a long list of image property descriptors that are not relevant to a specific user.

The network-based image management system 100 is efficient and accessible. The digital images from a plurality of users can be stored on image storage 150. Each image is identified by a unique image identifier and can be assigned with one or more image property descriptors. Each user is identified by a user identifier. On the image index storage 130, the image identifiers are listed in a flat file indexed by image quality descriptors for each user directory. Each user directory is indexed by an unique user identifier. Given a set of search criteria, the images can be quickly identified by matching the user identifier and the image property descriptors without time-consuming data-base queries.

Typical search parameters can include images captured, uploaded, viewed, or with products ordered in certain period of time. The search parameters can also include images tagged by properties such as "favorite", "wedding", "vacation", "graduation", or "anniversary". The return data record can include all image identifiers matching these search criteria as well as the image location on the storage 150. The application server can quickly display images in a web browser to show the user the content of the images obtained by the search.

What is claimed is:

1. An image management system, comprising:
   a first storage device configured to store a list of image identifiers indexed by one or more image property descriptors, wherein each of the image identifiers corresponds to a digital image;
   a second storage device configured to store digital images corresponding to the image identifiers;

an index processor in communication with the first storage device, configured to write the image identifiers and the associated image property descriptors for each image identifier in the first storage device;

a search data fetcher in communication with the index processor and the second storage device, wherein the search data fetcher is configured to receive information about image identifiers and image property descriptors associated with the image identifiers; and a search processor in communication with the first storage device, configured to receive a specified image property descriptor and to identify one or more image identifiers that match the specified image property descriptor.

2. The image management system of claim 1, wherein the image identifiers are separated in a plurality of user directories each indexed by a unique user identifier.

3. The image management system of claim 2, wherein the image identifiers in each user directory is indexed by one or more image property descriptors specific to the corresponding user identifier.

4. The image management system of claim 2, wherein the index processor is configured to write the image identifiers and the associated image property descriptors in different user directories in the image index storage.

5. The image management system of claim 2, wherein the search processor is configured to receive a specified image property descriptor for a user identifier and to identify one or more image identifiers that match the specified image property descriptors for the user identifier.

6. The image management system of claim 1, wherein the search data fetcher is configured to receive image identifiers associated with a user identifier, and image property descriptors associated with the user identifier and the image identifiers.

7. The image management system of claim 6, wherein the search data fetcher is configured to write updated information about user identifiers, image identifiers, and the image property descriptors associated with user identifiers to the first storage device.

8. The image management system of claim 6, further comprising:

an application server in communication with the search data fetcher, configured to send image index update information to the search data fetcher in accordance to the user input or user activities at the application server.

9. The image management system of claim 1, further comprising:

an application server in communication with the search processor, configured to receive an image search criterion comprising the specified image property descriptors for a specified user identifier.

10. The image management system of claim 9, wherein the search processor is configured to identify one or more image identifiers indexed by the specified image property descriptors in the image search criterion.

11. The image management system of claim 10, wherein the search processor is configured to determine locations of digital images on the second storage based on the one or more image identifiers associated with the digital images.

12. The image management system of claim 1, wherein the first storage device is configured to store locations of the digital images on the second storage device in association with the image identifiers of the digital images.

13. The image management system of claim 1, wherein the image property descriptors include one or more of image capture date, image capture time, image upload date, image view time, image edition time, product order information, image file name, image title, image favorite information, and text information for the back of an image print.

14. An image management system, comprising:

a first storage device configured to store a list of image identifiers indexed by one or more image property descriptors in a plurality of user directories each indexed by a unique user identifier, wherein each of the image identifiers corresponds to a digital image;

a second storage device configured to store digital images corresponding to the image identifiers, wherein the first storage device is configured to store locations of the digital images on the second storage device in association with the image identifiers of the digital images;

an index processor in communication with the first storage device, configured to write the image identifiers and the associated image property descriptors in different user directories in the first storage device; and a search processor in communication with the first storage device, configured to receive a specified image property descriptor for a user identifier and to identify one or more image identifiers that match the specified image property descriptor for the user identifier.

15. The image management system of claim 14, wherein the image identifiers in each user directory is indexed by one or more image property descriptors specific to the corresponding user identifier.

16. The image management system of claim 14, further comprising:

a search data fetcher configured to receive updated information about a user identifier, image identifiers associated with the user identifier, and image property descriptors associated with user identifier and image identifiers and to write updated information about user identifiers, image identifiers, and the image property descriptors associated with user identifiers to the first storage device.

17. The image management system of claim 16, further comprising:

an application server in communication with the search data fetcher, configured to send image index update information to the search data fetcher in accordance to the user input or user activities at the application server.

18. The image management system of claim 14, wherein the application sewer is configured to receive an image search criterion comprising the specified image property descriptors for a specified user identifier.

19. The image management system of claim 18, wherein the search processor is configured to identify one or more image identifiers indexed by the specified image property descriptors and to determine locations of digital images on the second storage based on the one or more image identifiers associated with the digital images.

20. The image management system of claim 14, wherein the image property descriptors include one or more of image capture date, image capture time, image upload date, image view time, image edition time, product order information, image file name, image title, image favorite information, and text information for the back of an image print.

* * * * *